United States Patent
Workman et al.

(10) Patent No.: US 7,119,449 B2
(45) Date of Patent: Oct. 10, 2006

(54) ENHANCEMENT OF UNDERFILL PHYSICAL PROPERTIES BY THE ADDITION OF THERMOTROPIC CELLULOSE

(75) Inventors: Derek B. Workman, Noblesville, IN (US); Arun K. Chaudhuri, Carmel, IN (US); David W. Ihms, Russiaville, IN (US)

(73) Assignee: Delphi Technologies, Inc., Troy, MI (US)

( * ) Notice: Subject to any disclaimer, the term of this patent is extended or adjusted under 35 U.S.C. 154(b) by 387 days.

(21) Appl. No.: 10/730,608

(22) Filed: Dec. 8, 2003

(65) Prior Publication Data

US 2005/0122697 A1    Jun. 9, 2005

(51) Int. Cl.
*H01L 23/29* (2006.01)

(52) U.S. Cl. .............. 257/789; 257/E23.119; 257/E23.116; 257/E23.123; 257/E23.124; 257/E23.125

(58) Field of Classification Search ............. None
See application file for complete search history.

(56) References Cited

U.S. PATENT DOCUMENTS

| | | | | |
|---|---|---|---|---|
| 4,632,798 A | * | 12/1986 | Eickman et al. | 264/272.17 |
| 4,720,424 A | * | 1/1988 | Eickman et al. | 428/323 |
| 4,869,847 A | * | 9/1989 | Leslie et al. | 252/299.01 |
| 5,084,203 A | * | 1/1992 | Sansone et al. | 252/299.5 |
| 5,097,317 A | * | 3/1992 | Fujimoto et al. | 257/786 |
| 5,158,990 A | * | 10/1992 | Bayer et al. | 522/83 |
| 5,575,949 A | * | 11/1996 | Benicewicz et al. | 252/299.01 |
| 5,894,173 A | * | 4/1999 | Jacobs et al. | 257/790 |
| 6,204,089 B1 | * | 3/2001 | Wang | 438/108 |
| 6,255,739 B1 | * | 7/2001 | Adachi et al. | 257/788 |
| 2004/0185603 A1 | * | 9/2004 | Jayaraman et al. | 438/108 |

OTHER PUBLICATIONS

European Search Report dated Mar. 15, 2005
Dai, Q., Chen, J., Huang, Y.; "Toughening of Epoxy Resin Blended with Thermotropi Hydroxyethyl Cellulose Acetate", Journal of Applied Polymer Science, vol. 70, (1998), pp. 1159-1163.

* cited by examiner

Primary Examiner—David A. Zarneke
(74) Attorney, Agent, or Firm—Jimmy L. Funke

(57) ABSTRACT

An electrical component having improved impact resistance and improved tolerance for thermal cycling, without sacrificing high-temperature performance, and without requiring unconventional and expensive manufacturing techniques includes an electric device mounted on a substrate circuit board, and a composite material underfilling, overmolding or encapsulating the electronic device, wherein the composite material includes a thermoset matrix phase and a discontinuous liquid crystal polymer phase dispersed throughout the thermoset matrix phase.

15 Claims, 1 Drawing Sheet

US 7,119,449 B2

ENHANCEMENT OF UNDERFILL PHYSICAL PROPERTIES BY THE ADDITION OF THERMOTROPIC CELLULOSE

TECHNICAL FIELD

This invention relates to encapsulation, overmolding and/or underfilling of electronic and/or electrical components for protection of the device and its electrical functions from thermal cycling, environmental exposure and/or mechanical shock or impact.

BACKGROUND OF THE INVENTION

Printed circuit boards and other electrical and/or electronic devices and/or components are often encapsulated, overmolded and/or underfilled with a polymeric material to provide protection against thermal cycling, moisture and/or mechanical impact. Encapsulation is typically achieved by employing a transfer molding process to encase the electrical device in a thermoset body. During the process the polymeric material must be in a liquid state to allow it to flow around and under various components and subsequently solidify by cross-linking. In order to allow the polymeric material to flow around and completely encapsulate the components without damaging fragile wiring and interconnections frequently used in electronic devices, the polymeric material must have a relatively low viscosity (e.g., typically less than 200 poise). Further, it is desirable that the cured or thermoset material exhibit excellent physical properties, e.g., strength, toughness and impact resistance. In addition, the thermoset materials used to encapsulate, overmold and/or underfill electronic components must typically exhibit a relatively low coefficient of thermal expansion to approximately match the coefficient of thermal expansion of the circuit board substrate on which the electronic component is mounted. More importantly, the coefficient of thermal expansion of the underfill should approximate that of the solder used for electrical connections. It is also very desirable that the thermoset encapsulating, overmolding and/or underfilling material have a relatively high glass transition temperature and is resistant to degradation at high temperatures.

On account of these somewhat conflicting requirements, conventional techniques for enhancing the toughness and impact strength of thermoset materials are generally inappropriate for encapsulation, overmolding and/or underfilling of electronic components. Conventional methods of increasing the toughness and impact resistance of thermoset resins include incorporation of reinforcing fibers and/or particles. Due to viscosity issues and filler separation, the incorporation of fiber reinforcing materials and rigid particles such as silica or glass spheres is unsuitable for encapsulation, overmolding and/or underfilling of electrical components mounted on a circuit board substrate. Enhanced toughness and impact resistance can be achieved without raising viscosity to an unacceptable level, while minimizing filler separation, by incorporating rubbery particles such as organosiloxane rubber, nitrile rubber or the like. However, the resulting composite material exhibits an unacceptably high coefficient of thermal expansion, an undesirably low glass transition temperature, and an undesirable tendency to degrade at higher temperatures.

Accordingly, there has been a recognized need for electrical components comprising a circuit board substrate and an electronic device mounted on the circuit board substrate wherein the electronic device is overmolded, encapsulated and/or underfilled with a thermoset material exhibiting enhanced toughness and impact resistance, and which overcomes the disadvantages associated with the use of conventional fiber, rigid particle and/or rubbery particle reinforcement.

SUMMARY OF THE INVENTION

The invention provides an improved electrical component including a composite encapsulating, overmolding and/or underfilling material that exhibits improved toughness and impact resistance as compared with the conventional thermoset mat used for underfilling, overmolding and/or encapsulating electronic devices, and without undesirably increasing the coefficient of thermal expansion, without undesirably lowering the glass transition temperature, and without degrading high temperature performance. In addition, the improved electrical components of this invention may be prepared from a thermosettable resin composition exhibiting a relatively low viscosity, none or very low filler separation, and compatibility with conventional manufacturing processes.

The electrical components of the invention include a substrate circuit board, an electronic device mounted on the circuit board, and a composite material encapsulating, overmolding or underfilling the electronic device, wherein the composite material includes a thermoset matrix material and a liquid crystalline polymer dispersed throughout the thermoset matrix material.

These and other features, advantages and objects of the present invention will be further understood and appreciated by those skilled in the art by reference to the following specification, claims and appended drawings.

DESCRIPTION OF THE PREFERRED EMBODIMENTS

Figure 1:
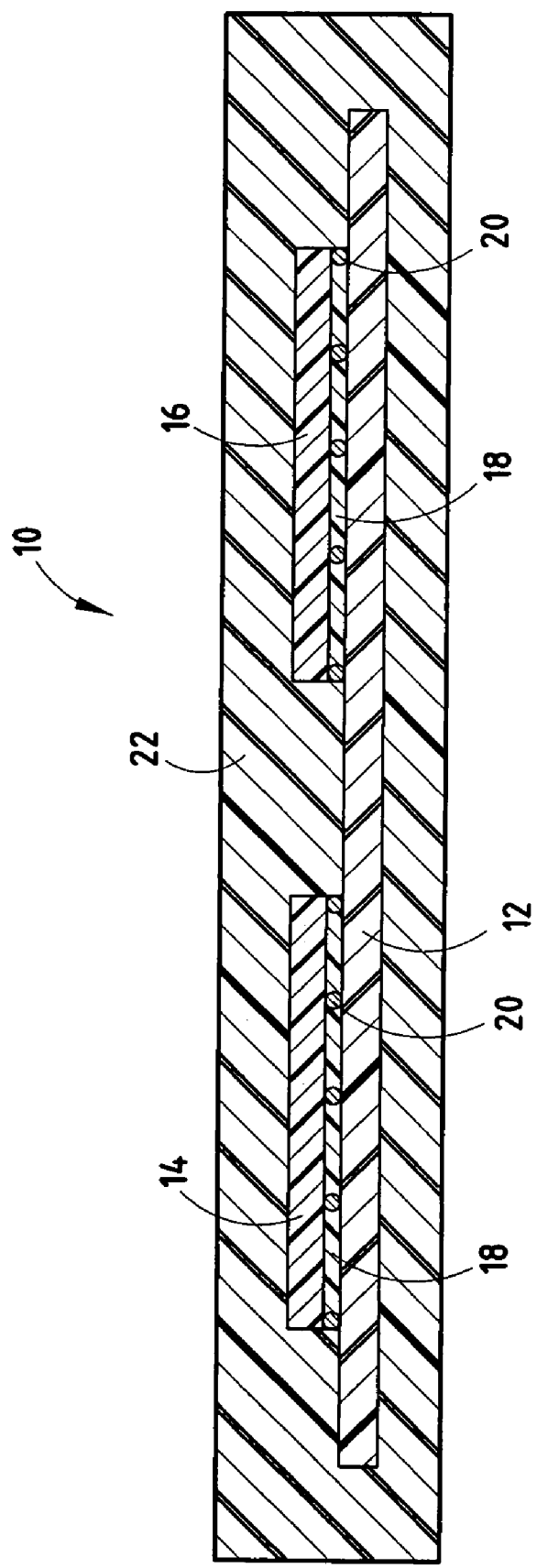
FIG. 1 is schematic cross section of a polymer overmolded and underfilled electrical component in accordance with the invention.

As used herein, the expression "encapsulate" and derivatives thereof refer to complete surrounding of or encasing of an electronic device mounted on a circuit board in a polymer matrix, with the only discontinuities in the encasement or encapsulation, if any, being for electrical leads. The term "overmolding" and derivatives thereof as used in the specification refers to an arrangement in which the protective polymer material together with a substrate (e.g., a circuit board) completely encases a subcomponent (e.g., an electronic device such as an integrated circuit). The expression "underfill" and derivatives thereof as used in the specification refers to filling of the space between a substrate (e.g., a circuit board) and a subcomponent (e.g., an integrated circuit) with the protective polymer material. Complete underfilling without risk of damaging electrical connections is very desirable to protect an electronic device such as an integrated circuit against damage due to mechanical shock or impact, even when the component is encapsulated or overmolded, and to protect against thermal cycling (e.g., temperature excursions in the range from about −60° C. to about 160° C.) and/or environmental exposure, even when the subcomponent is not encapsulated or overmolded. Overmolding, underfilling and encapsulation may be employed in combination or individually, with the same or different materials in one or multiple steps.

FIG. 1 shows an electrical component 10 in accordance with an embodiment of the invention. Electrical component 10 includes a substrate circuit board 12 (e.g., a printed circuit board) and electronic devices 14, 16 (e.g., semiconductor chips) mounted on and electrically connected to conductive pathways of substrate circuit board 12. A composite material 18 fills space between an underside of electronic device 14 and an upper surface of substrate circuit board 12. This material may be referred to as an "underfill" that helps protect electronic device 14 from environmental exposure, shock and/or impact. Similarly, a thermoset matrix underfill 18 is disposed between an underside of electronic device 16 and an upper surface of substrate circuit board 12. The standoff height for a flip chip is typically about 75 to 100 microns. Electronic devices 14 and 16 are electrically connected to electrically conductive pathways or circuit segments by solder connections 20. As shown in the illustrated embodiment, the entire electrical component 10 may be encapsulated in a thermoset material 22, which may be the same as, or different from, the underfill material 18. Alternatively, electronic devices 14 and 16 may be overmolded with a thermoset material that is the same as, or different from, thermoset material 18. Overmolding differs from encapsulation, in that the electronic devices 14, 16 are completely surrounded or enveloped by the overmolding thermoset material and the substrate circuit board, but the substrate circuit board is not entirely encompassed by or encapsulated within the overmolding thermoset material, i.e., the edges of the overmolding material terminate and are engaged with an upper surface of substrate circuit board 12.

In accordance with the principles of this invention, at least one of the underfilling material 18, the overmolding material (if employed) and encapsulating material 22 is a composite material including a continuous thermoset matrix phase and a discontinuous liquid crystalline polymer phase dispersed throughout the thermoset matrix phase.

Examples of preferred continuous thermoset matrix phases include the products of a reaction between a compound having two or more epoxy groups and a curing agent (e.g., an amine compound) having two or more reactive sites. At least one of the epoxy-functionalized compounds or at least one of the curing agents must have a functionality of at least three in order to permit cross-linking and formation of a thermoset material. Suitable epoxy resin systems that may be used in the invention include various well-known and widely employed compositions containing one or more diglycidyl ethers of bisphenol A and/or bisphenol F, and one or more curing agents or hardeners such as various aliphatic and/or aromatic amines, ureas, etc. Other thermoset materials may be derived from liquid bismaleimide systems, phenolic resin systems, polyester resin systems, etc.

The expression "liquid crystalline polymers" is well-known in the art and generally refers to polymers capable of forming an anisotropic melt. This characteristic is generally attributed to the presence of rod-like molecular chains that have a tendency in the molten or dissolved state to become unidirectionally aligned (i.e., oriented) in parallel fashion. Evidence of this type of ordered structure includes the ability to transmit light in optical systems equipped with crossed polarizers.

A preferred liquid crystalline polymer for use in the invention is hydroxyethyl cellulose acetate. Examples of other liquid crystalline polymers include oxybenzoyl copolyesters.

The above-referenced example of a preferred liquid crystalline polymer for use in the invention (hydroxyethyl cellulose acetate) is a thermotropic material having a liquid crystalline phase that can exist in the temperature range from 135° C. to 185° C. Uncured diglycidyl ether of bisphenol A is miscible with hydroxyethyl cellulose acetate. Similarly, uncured diglycidyl ether of bisphenol F is expected to be miscible with hydroxyethyl cellulose acetate. Blends of hydroxyethyl cellulose acetate and diglycidyl ether of bisphenol A or bisphenol F are homogeneous and transparent. No phase separation is observed for these blends. Upon curing of the epoxy resin material, the hydroxyethyl cellulose acetate becomes immiscible and forms a discontinuous dispersed phase. The discrete particles of hydroxyethyl cellulose acetate are typically in the form of particles or globules having a size in the range of from about 0.2 to 0.5 microns. It is believed that the optimum improvement in impact strength is achieved in a composite containing approximately 10 weight percent hydroxyethyl cellulose acetate. It is also believed that the maximum toughening effect is achieved when the epoxy resin is cured at a temperature of about 150° C.

An advantage of the invention is that conventional no-flow and capillary underfilling may be employed without separation of the phases, resulting in a tougher, more impact resistant underfill, and more robust electrical components which may continue to perform well for a more extended period of time under adverse and/or hostile conditions. Similar advantages may be achieved by utilizing the disclosed thermoset composite materials to overmold an electronic device mounted on a substrate circuit board, or to completely encapsulate an electrical component.

In accordance with the principles of this invention, desirable rheological properties and toughening effects are achieved by application of a homogeneous miscible blend of a liquid thermosetttable composition and a liquid crystalline polymer followed by in situ formation of discrete toughening filler particles during curing. In addition, it is believed that the use of a liquid crystalline polymer toughening filler achieves a very desirable improvement in toughness and impact resistance without an undesirable increase in the coefficient of thermal expansion and without an undesirable decrease in glass transition temperature. In addition, the improvement in toughening effect and impact resistance is achieved without any sacrifice in high-temperature performance.

Although hydroxyethyl cellulose acetate is not, to the inventor's knowledge, commercially available, techniques for preparing hydroxyethyl cellulose acetate have been published and are well-known. Further, techniques for preparing various other suitable liquid crystalline polymers are well-known to those having ordinary skill in the art and/or are commercially available.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. An electrical component comprising:
    a substrate circuit board;
    an electronic device mounted on the substrate circuit board in spaced relationship from the substrate circuit board; and
    a composite material underfilling, overmolding or encapsulating the electronic device, the composite material including a continuous thermoset matrix phase and a discontinuous liquid crystalline polymer phase dispersed throughout the thermoset matrix phase, wherein the dispersed liquid crytalline polymer is in the form of particles having an average size of from about 0.2 microns to about 0.5 microns.

2. The electrical component of claim 1, wherein the electronic device is an integrated circuit device.

3. The electrical component of claim 1, wherein the thermoset material is the cured product of a liquid epoxy resin system.

4. The electrical component of claim 1, wherein the liquid crystalline polymer is hydroxyethyl cellulose acetate.

5. The electrical component of claim 1, wherein the dispersed liquid crystalline polymer is present in the composite material in an amount of about 10 percent by weight.

6. An electrical component comprising:
a substrate circuit board;
an electronic device mounted on the substrate circuit board in spaced relationship from the substrate circuit board; and
a composite material underfilling, overmolding or encapsulating the electronic device, the composite material including a continuous thermoset matrix phase and a discontinuous liquid crystalline polymer phase dispersed throughout the thermoset matrix phase, wherein the dispersed liquid crystalline polymer is present in the composite material in an amount of about 10 percent by weight.

7. The electrical component of claim 6, wherein the electronic device is an integrated circuit device.

8. The electrical component of claim 6, wherein the thermoset material is the cured product of a liquid epoxy resin system.

9. The electrical component of claim 6, wherein the liquid crystalline polymer is hydroxyethyl cellulose acetate.

10. An electrical component comprising:
a substrate circuit board;
an electronic device mounted on the substrate circuit board in spaced relationship from the substrate circuit board; and
a composite material underfilling the electronic device, the composite material including a continuous thermoset matrix phase and a discontinuous liquid crystalline polymer phase dispersed throughout the thermoset matrix phase.

11. The electrical component of claim 10, wherein the electronic device is an integrated circuit device.

12. The electrical component of claim 10, wherein the thermoset material is the cured product of a liquid epoxy resin system.

13. The electrical component of claim 10, wherein the liquid crystalline polymer is hydroxyethyl cellulose acetate.

14. The electrical component of claim 10, wherein the dispersed liquid crystalline polymer is in the form of particles having an average size of from about 0.2 microns to about 0.5 microns.

15. The electrical component of claim 10, wherein the dispersed liquid crystalline polymer is present in the composite material in an amount of about 10 percent by weight.

* * * * *